(12) United States Patent
Farkas et al.

(10) Patent No.: US 12,417,197 B2
(45) Date of Patent: Sep. 16, 2025

(54) SYSTEM TO MINIMIZE EFFECTS OF GROUND PLANE NOISE

(71) Applicant: Dell Products L.P., Round Rock, TX (US)

(72) Inventors: Sandor Tibor Farkas, Round Rock, TX (US); Bhyrav M. Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 78 days.

(21) Appl. No.: 18/408,736

(22) Filed: Jan. 10, 2024

(65) Prior Publication Data

US 2025/0225088 A1    Jul. 10, 2025

(51) Int. Cl.
| | |
|---|---|
| *G06F 13/20* | (2006.01) |
| *G06F 13/16* | (2006.01) |
| *G06F 13/40* | (2006.01) |
| *H03M 1/12* | (2006.01) |
| *H04B 1/04* | (2006.01) |
| *H04B 1/16* | (2006.01) |

(52) U.S. Cl.
CPC .......... *G06F 13/20* (2013.01); *G06F 13/1668* (2013.01); *G06F 13/4022* (2013.01); *H03M 1/12* (2013.01); *H04B 1/04* (2013.01); *H04B 1/16* (2013.01)

(58) Field of Classification Search
None
See application file for complete search history.

(56) References Cited

U.S. PATENT DOCUMENTS

| | | | | |
|---|---|---|---|---|
| 8,742,831 | B2 * | 6/2014 | Fechner | G05F 1/46 327/534 |
| 9,882,539 | B1 * | 1/2018 | Shringarpure | H04B 10/616 |
| 2004/0174349 | A1 * | 9/2004 | Libsch | H10D 86/00 257/E27.111 |
| 2010/0103759 | A1 * | 4/2010 | Ouyang | G11C 5/147 365/226 |
| 2010/0149861 | A1 * | 6/2010 | Park | G11C 13/0069 365/163 |

\* cited by examiner

*Primary Examiner* — Michael Sun
(74) *Attorney, Agent, or Firm* — McDermott Will & Schulte LLP (57) ABSTRACT

A system to minimize effects of ground plane noise, including a processing unit including a first transmitter, a first receiver, and a first transistor, wherein the first transistor is coupled to the first receiver, the first transistor associated with a first ground voltage; and a memory device including a second transmitter, a second receiver, and a second transistor, wherein the second transistor is coupled to the second receiver, the second transistor associated with a second ground voltage; wherein the processing unit is coupled to the memory device, wherein the first transistor is coupled to the second transistor, wherein, when the processing unit is transmitting data to the memory device, the processing unit enables the first transistor and the memory device disables the second transistor such that a second threshold voltage associated with the second receiver is adjusted based on the first ground voltage.

12 Claims, 4 Drawing Sheets

SYSTEM TO MINIMIZE EFFECTS OF GROUND PLANE NOISE

BACKGROUND

Field of the Disclosure

The disclosure relates generally to a system to minimize effects of ground plane noise.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Differential signaling is the preferred choice of transferring high speed data due to its common mode noise rejection properties. However, not all high-speed busses are differential. A memory bus can use single ended signaling, making it susceptible to noise from various sources.

SUMMARY

Innovative aspects of the subject matter described in this specification may be embodied in a system of a system to minimize effects of ground plane noise, including a processing unit including a first transmitter, a first receiver, and a first transistor, wherein the first transistor is coupled to the first receiver, the first transistor associated with a first ground voltage; and a memory device including a second transmitter, a second receiver, and a second transistor, wherein the second transistor is coupled to the second receiver, the second transistor associated with a second ground voltage; wherein the processing unit is coupled to the memory device, wherein the first transistor is coupled to the second transistor, wherein, when the processing unit is transmitting data to the memory device, the processing unit enables the first transistor and the memory device disables the second transistor such that a second threshold voltage associated with the second receiver is adjusted based on the first ground voltage.

Other embodiments of these aspects include corresponding methods and apparatus.

These and other embodiments may each optionally include one or more of the following features. For instance, an output of the first transmitter and an input of the first receiver is coupled to an output of the second transmitter and an input of the second receiver. The first transistor is associated with the first ground voltage at a first location of a ground plane, and the second transistor is associated with the second ground voltage at the second location of the ground plane. The first transistor is coupled to the second transistor via a ground compensation trace. The ground compensation trace is an existing trace. The processing unit enables the first transistor and the memory device disables the second transistor such that the first ground voltage associated with the first receiver is added to the second threshold voltage associated with the second receiver. The processing unit enables the first transistor and the memory device disables the second transistor such that a voltage difference between the first ground voltage and the second ground voltage is negated. When the memory device is transmitting data to the processing unit, the processing unit disables the first transistor and the memory device enables the second transistor such that a first threshold voltage associated with the first receiver is adjusted based on the second ground voltage.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses a system to minimize effects of ground plane noise. In short, voltage drops (static and dynamic) can occur at a motherboard—i.e., a power supply can cease to provide power to the motherboard. For example, a power supply can have a failure, the power cord becomes unplugged from the information handling system, or the power supply becomes missing. When a power supply (of multiple power supplies) ceases to provide power to the motherboard, there is a voltage gradient along the ground plane of the motherboard. As a result, there is ground voltage drop along the motherboard.

Specifically, this disclosure discusses a system for minimizing effects of ground plane noise, including a processing unit including a first transmitter, a first receiver, and a first transistor, wherein the first transistor is coupled to the first receiver, the first transistor associated with a first ground voltage; and a memory device including a second transmitter, a second receiver, and a second transistor, wherein the second transistor is coupled to the second receiver, the second transistor associated with a second ground voltage; wherein the processing unit is coupled to the memory device, wherein the first transistor is coupled to the second transistor, wherein, when the processing unit is transmitting data to the memory device, the processing unit enables the first transistor and the memory device disables the second transistor such that a second threshold voltage associated with the second receiver is adjusted based on the first ground voltage.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such as wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Figure 1:
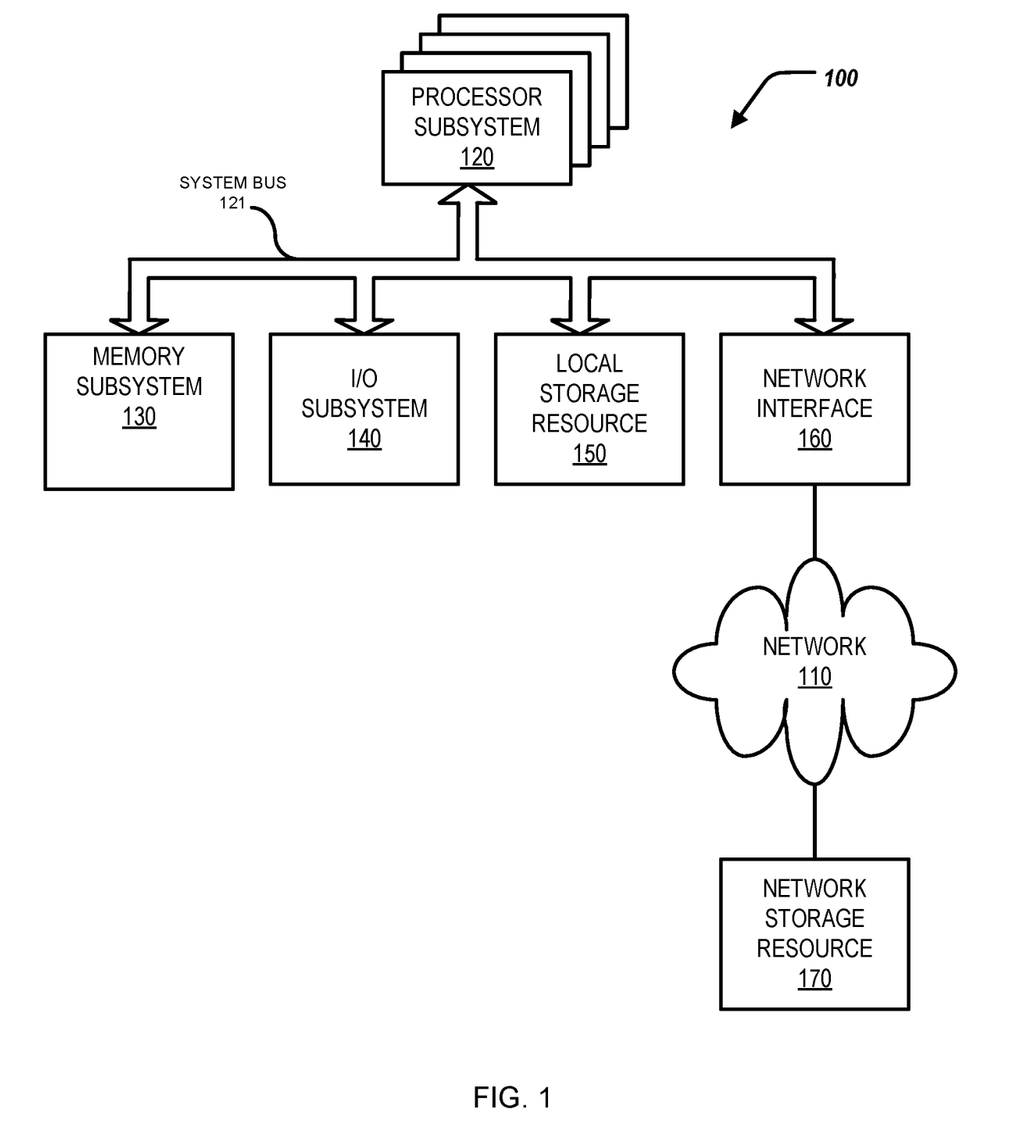
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include one or more processing resources such as a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other types of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other types of rotating storage media, flash memory, EEPROM, and/or other types of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g., corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g., customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet, or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
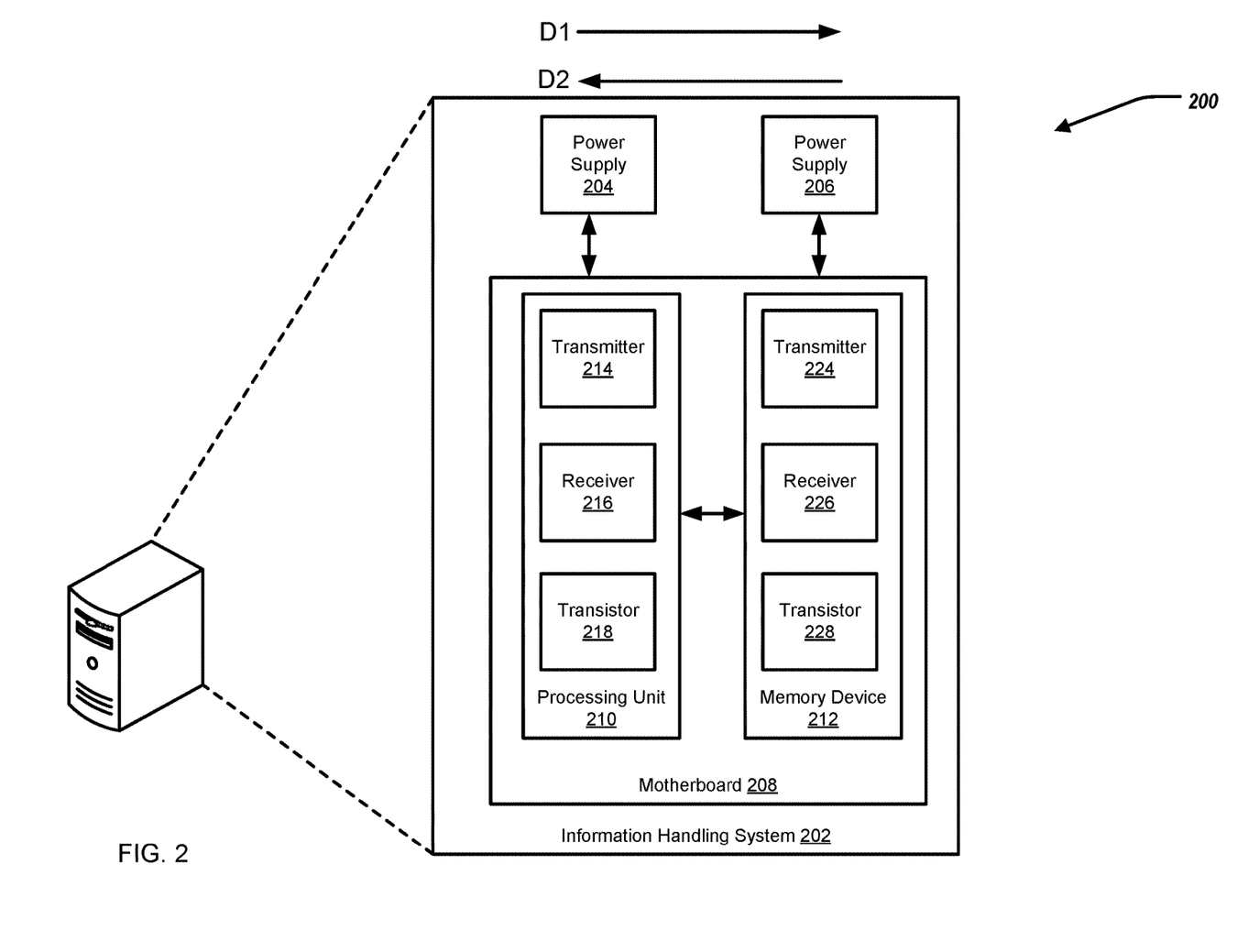
FIG. 2 illustrates a block diagram of an information handling system to minimize effects of ground plane noise, in a first implementation.

Turning to FIG. 2, FIG. 2 illustrates an environment 200 including an information handling system 202. The information handling system 202 can include a power supply 204, a power supply 206, and a motherboard 208. In some examples, the information handling system 202 is similar to, or includes, the information handling system 100 of FIG. 1.

The motherboard 208 can include a processing unit 210 and a memory device 212. The processing unit 210 can be in communication with the memory device 212.

The processing unit 210 can include a first transmitter 214, a first receiver 216, and a first transistor 218. The first transistor 218 can be a field-effect transistor (FET). In some examples, the processing unit 210 is a central processing unit (CPU). In some examples, the processing unit 210 is the same, or substantially the same, as the processor subsystem 120 of FIG. 1.

The memory device 212 can include a second transmitter 224, a second receiver 226, and a second transistor 228. The second transistor 228 can be a field-effect transistor (FET). In some examples, the memory device 212 is a dual in-line memory module (DIMM). In some examples, the memory device 212 is the same, or substantially the same, as the memory subsystem 130 of FIG. 1. The power supplies 204 and 206 can provide power to the motherboard 208.

In short, voltage drops (static and dynamic) can occur at the motherboard 208. Specifically, one of the power supplies 204, 206 can cease to provide power to the motherboard 208. For example, one of the power supplies 204, 206 can have a failure, have the power cord unplugged from the information handling system 202, or one of the power supplies 204, 206 becomes missing. For example, the power supply 206 ceases to provide power to the motherboard 208. When the power supply 206 ceases to provide power to the motherboard 208, there is a voltage gradient along the ground plane of the motherboard 208. For example, when only the power supply 204 is providing power to the motherboard 208, power is provided generally along the direction D1, and the return ground current can travel along the direction D2, opposite to the direction D1. As a result, there is a ground voltage drop at the motherboard 208. That is, there is a different voltage at the processing unit 210 as compared to the voltage at the memory device 212, detailed further herein.

Figure 3:
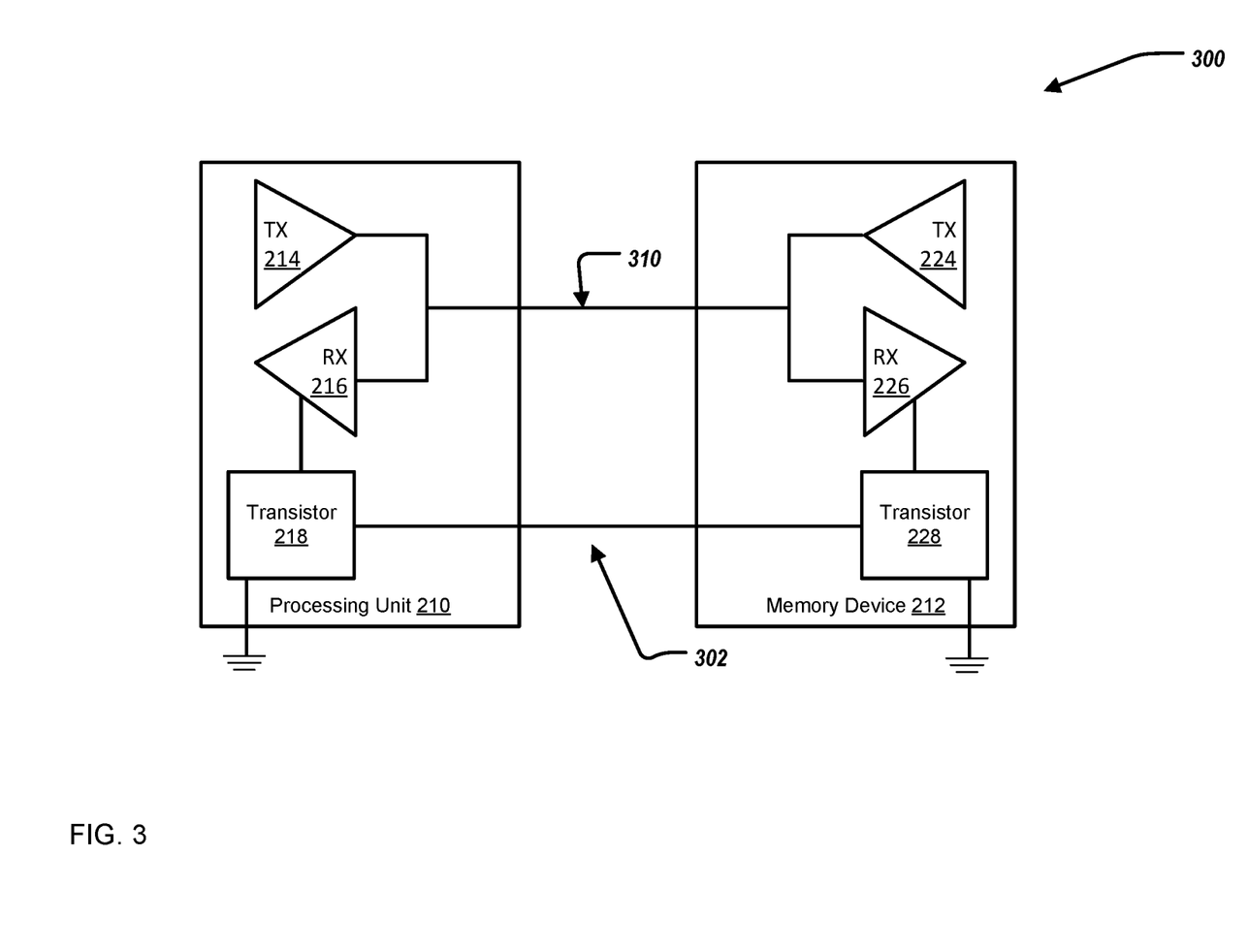
FIG. 3 illustrates a block diagram of a processing unit and memory device of the information handling system.

FIG. 3 illustrates a system 300 to minimize the effects of ground plane noise. The processing unit 210 can include the first transmitter 214, the first receiver 216, and the first transistor 218. The first transmitter 214 is coupled to the first receiver 216. The first transistor 218 is coupled to the first receiver 216. The first transistor 218 is associated with a first ground voltage. For example, the first ground voltage is a voltage of the ground plane at a location proximate to the processing unit 210 physically on the motherboard 208. That is, the first transistor 218 is associated with the first ground voltage at a first location of the ground plane.

Furthermore, the memory device 212 can include the second transmitter 224, the second receiver 226, and the second transistor 228. The second transmitter 224 is coupled to the second receiver 226. The second transistor 228 is coupled to the second receiver 226. The second transistor 228 is associated with a second ground voltage. For example, the second ground voltage is a voltage of the ground plane at a second location proximate to the memory device 212 physically on the motherboard 208. That is, the second transistor 228 is associated with the second ground voltage at a second location of the ground plane.

The processing unit 210 is coupled to the memory device 212. Specifically, the output of the first transmitter 214 is coupled to the input of the first receiver 216; and the output of the second transmitter 224 is coupled to the input of the second receiver 226. Furthermore, the output of the first transmitter 214 and the input of the first receiver 216 is coupled to the output of the second transmitter 224 and the input of the second receiver 226, shown by communication channel 310. Thus, the processing unit 210 is in communication with the memory device 212; and the processing unit 210 is coupled to the memory device 212.

The first transistor 218 is coupled to the second transistor 228. Specifically, the first transistor 218 is coupled to the second transistor 228 via a ground compensation trace 302. In some examples, the ground compensation trace 302 is an existing trace of the motherboard 208. For example, the ground compensation trace 302 can include a ground compensation signal that is an additional pin, or one of the existing bidirectional signals that can be reused of the motherboard 208. For example, serial data (SDA) that is normally used as serial presence detect (SPD) data can be used as ground compensation during communication (transactions) between the processing unit 210 and the memory device 212.

To that end, the processing unit 210 can transmit data to the memory device 212 over the communication channel 310. For example, the processing unit 210 is "writing" data to the memory device 212. When the processing unit 210 is transmitting data to the memory device 212, the processing unit 210 enables the first transistor 218 and the memory device 212 disables the second transistor 228. As a result, the ground compensation trace 302 has the ground potential of the processing unit 210 at the first transistor 218 (e.g., a "copy" of the ground voltage at the processing unit 210). By having the ground compensation trace 302 have the ground voltage of the processing unit 210 at the first transistor 218, a second threshold voltage associated with the memory device 212 can be adjusted. Specifically, the second threshold voltage associated with the memory device 212, and in particular, the second receiver 216, can be adjusted based on the first ground voltage that is associated with the processing unit 210, and in particular, the first transistor 218.

In some examples, the processing unit 210 enables the first transistor 218 and the memory device 212 disables the second transistor 228 such that the first ground voltage associated with the processing unit 210 is added to the second threshold voltage associated with the memory device 212. Specifically, the processing unit 210 enables the first transistor 218 and the memory device 212 disables the second transistor 228 such that a voltage difference between the first ground voltage associated with the processing unit 210 and the second ground voltage associated with the memory device 212 is negated, or compensated for. Thus, the ground offset and noise of the ground plane associated with the motherboard 208 is cancelled (or effectively cancelled).

For example, the second ground voltage associated with the memory device 212 is 10 mV higher than the first ground voltage associated with the processing unit 210. Thus, the second voltage threshold associated with the memory device 212 needs to be lowered by 10 mV. The processing unit 210 enables the first transistor 218. The memory device 212 disables the second transistor 228, and adds the voltage of the ground compensation trace 302 (−10 mV from the point of view of the second transistor 228) to the second voltage threshold associated with the memory device 212, effectively cancelling the ground voltage difference.

In some further embodiments, the memory device 212 can transmit data to the processing unit 210 over the communication channel 310. For example, the memory device 212 is providing data to the processing unit 210 (the processing unit 210 is "reading" data from the memory device 212). When the memory device 212 is transmitting data to the processing unit 210, the processing unit 210 disables the first transistor 218 and the memory device 212 enables the second transistor 228. As a result, the ground compensation trace 302 has the ground potential of the memory device 212 at the second transistor 228 (e.g., a "copy" of the ground voltage at the memory device 212). By having the ground compensation trace 302 have the ground voltage of the memory device 212 at the second transistor 228, the first threshold voltage associated with the processing unit 210 can be adjusted. Specifically, the first threshold voltage associated with the processing unit 210, and in particular, the first receiver 126, can be adjusted based on the second ground voltage that is associated with the memory device 212, and in particular, the second transistor 228.

In some examples, the memory device 212 enables the second transistor 228 and the processing unit 210 disables the first transistor 218 such that the second ground voltage associated with the memory device 212 is added to the first threshold voltage associated with the processing unit 210. Specifically, the processing unit 210 disables the first transistor 218 and the memory device 212 enables the second transistor 228 such that a voltage difference between the first ground voltage associated with the processing unit 210 and the second ground voltage associated with the memory device 212 is negated, or compensated for. Thus, the ground offset and noise of the ground plane associated with the motherboard 208 is cancelled (or effectively cancelled).

For example, the first ground voltage associated with the processing unit 210 is 10 mV lower than the second ground voltage associated with the memory device 212. Thus, the first voltage threshold associated with the processing unit 210 needs to be raised by 10 mV. The memory device 212 enables the second transistor 228. The processing unit 210 disables the first transistor 218, and adds the voltage of the ground compensation trace 302 (10 mV from the point of view of the first transistor 218) to the first voltage threshold associated with the processing unit 210, effectively cancelling the ground voltage difference.

Figure 4:
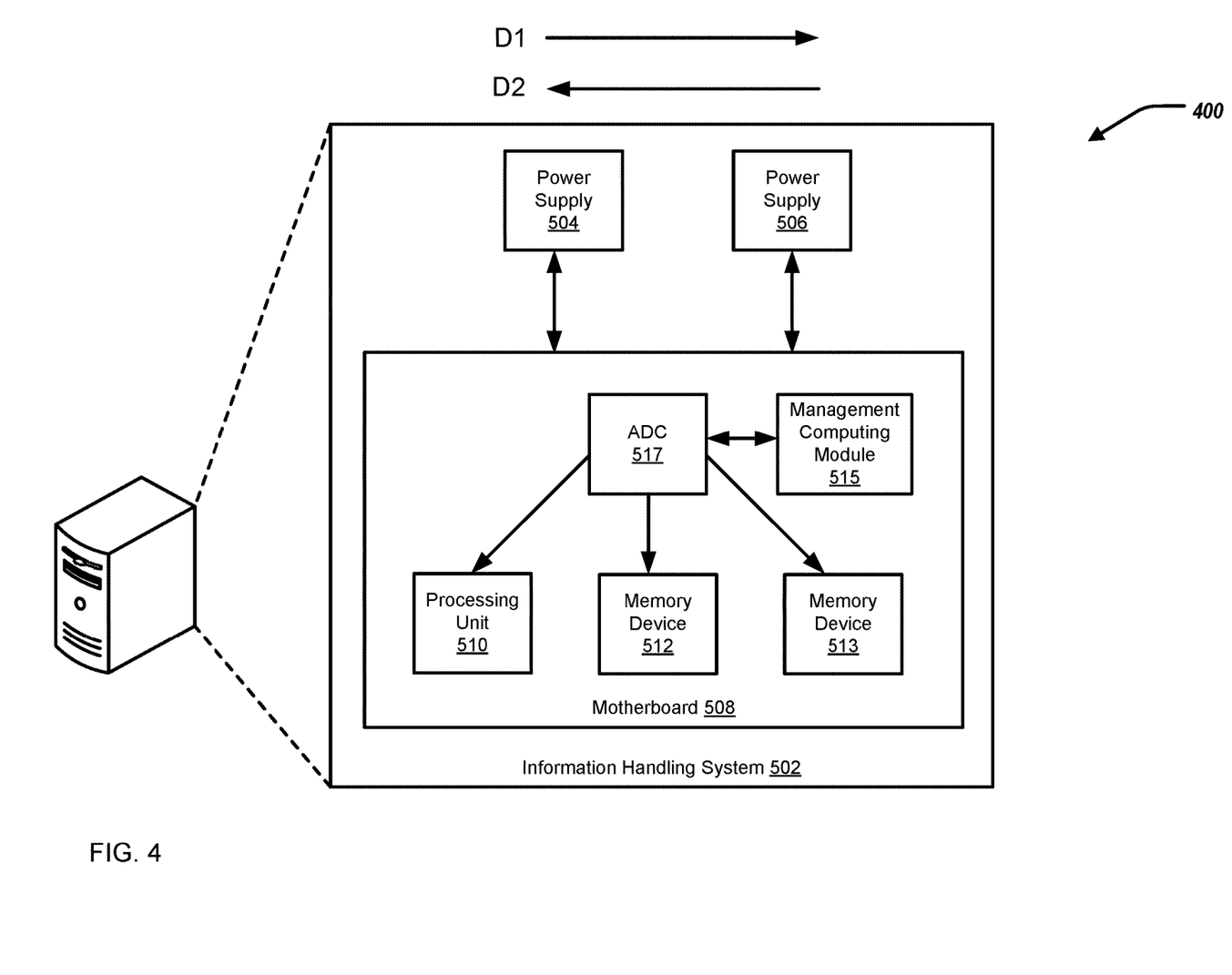
FIG. 4 illustrates a block diagram of an information handling system to minimize effects of ground plane noise, in a second implementation.

Turning to FIG. 4, FIG. 4 illustrates an environment 500 including an information handling system 502. The information handling system 502 can include a power supply 504, a power supply 506, and a motherboard 508. In some examples, the information handling system 502 is similar to, or includes, the information handling system 100 of FIG. 1.

The motherboard 508 can include a processing unit 510, a first memory device 512, a second memory device 513, a management computing module 515, and an analog to digital converter (ADC) 517. The processing unit 510 can be in communication with the memory devices 512, 513.

In some examples, the processing unit 510 is a central processing unit (CPU). In some examples, the processing unit 510 is the same, or substantially the same, as the processor subsystem 120 of FIG. 1.

In some examples, the memory device 512 is a dual in-line memory module (DIMM). In some examples, the memory device 512 is the same, or substantially the same, as the memory subsystem 130 of FIG. 1. In some examples, the memory device 513 is a dual in-line memory module (DIMM). In some examples, the memory device 513 is the same, or substantially the same, as the memory subsystem 130 of FIG. 1. The power supplies 504 and 506 can provide power to the motherboard 508.

In some examples, the management computing module 515 is included by an embedded controller (EC) of the information handling system 502. In some examples, the management computing module 515 is included by a baseband management controller (BMC) of the information handling system 502.

The ADC 517 is in communication with the processing unit 510, the memory device 512, the memory device 513, and the management computing module 515.

In short, voltage drops (static and dynamic) can occur at the motherboard 508. Specifically, one of the power supplies 504, 506 can cease to provide power to the motherboard 508. For example, one of the power supplies 504, 506 can have a failure, have the power cord unplugged from the information handling system 502, or one of the power supplies 504, 506 becomes missing. For example, the power supply 506 ceases to provide power to the motherboard 508. When the power supply 506 ceases to provide power to the motherboard 508, there is a voltage gradient along the ground plane of the motherboard 508. For example, when only power supply 504 is providing power to the motherboard 508, power is provided generally along the direction D1, and the return ground current can travel along the direction D2, opposite to the direction D1. As a result, there is ground voltage drop at the motherboard 508. That is, there is a different voltage at the processing unit 510 as compared to the voltage at the memory device 512, detailed further herein.

The ADC 517 is configured to determine a first ground voltage at the processing unit 510 and a second ground voltage at the memory device 512. For example, the first ground voltage and the second ground voltage can both be static. The ADC 517 measures the first ground voltage at a first location proximate to the processing unit 510 and the second ground voltage at a second location proximate to the memory device 512. For example, the ADC 517 measures the first ground voltage near pins of the processing unit 510 and measures the second ground voltage near pins of the memory device 512. In some examples, if the ground return current is not predominantly perpendicular to the memory device 512, the ADC 517 can measure the second ground voltage at several test points proximate to the memory device 512.

For example, the ADC 517 measures the first ground voltage at the processing unit 510 as 10 mV; and the second ground voltage at the memory device 512 as 20 mV.

The management computing module 515 is configured to calculate a voltage delta between the first ground voltage at the processing unit 510 and the second ground voltage at the memory device 512. The management computing module 515 adjusts, based on the voltage delta, a first voltage threshold associated with the processing unit 510. That is, the management computing module 515 adjusts the first voltage threshold associated with the processing unit 510 to compensate for voltage drops in the ground plane of the motherboard 508.

In some examples, the management computing module 515 adjusts the first voltage threshold associated with the processing unit 510 such that the second ground voltage associated with the memory device 512 is added to the first voltage threshold associated with the processing unit 510. Specifically, the management computing module 515 adjusts the first voltage threshold associated with the processing unit 510 such that a voltage difference between the first ground voltage associated with the processing unit 510 and the second ground voltage associated with the memory device 512 is negated, or compensated for. Thus, the ground offset and noise of the ground plane associated with the motherboard 508 is cancelled (or effectively cancelled).

For example, the first ground voltage associated with the processing unit 510 is 10 mV lower than the second ground voltage associated with the memory device 512. Thus, the first voltage threshold associated with the processing unit 510 needs to be raised by 10 mV for memory reads; and the second voltage threshold associated with memory device 512 needs to be lowered by 10 mV for memory writes. The management computing module 515 adjusts the first voltage threshold associated with the processing unit 510 to add 10 mV to the first voltage threshold, and adjusts the second voltage threshold associated with the memory device 512 to subtract 10 mV to the second voltage threshold.

In some examples, the management computing module 515 adjusts a second voltage threshold associated with the memory device 512 such that the first ground voltage associated with the processing unit 510 is added to the second voltage threshold associated with the memory device 512. Specifically, the management computing module 515 adjusts the second voltage threshold associated with the memory device 512 such that a voltage difference between the first ground voltage associated with the processing unit 510 and the second ground voltage associated with the memory device 512 is negated, or compensated for. Thus, the ground offset and noise of the ground plane associated with the motherboard 508 is cancelled (or effectively cancelled).

For example, the second ground voltage associated with the memory device 512 is 10 mV higher than the first ground voltage associated with the processing unit 510. Thus, the second voltage threshold associated with the memory device 512 needs to be lowered by 10 mV for memory writes; and the first voltage threshold associated with the processing unit 510 needs to be raised by 10 mV for memory reads. The management computing module 515 adjusts the second voltage threshold associated with the memory device 512 to lower the second voltage threshold by 10 mV, and adjusts the first voltage threshold associated with the processing unit 510 to add 10 mV to the first voltage threshold.

In some implementations, the ADC 517 is further configured to determine a third ground voltage at the memory device 512. For example, the third ground voltage can be static. The ADC 517 measures the third ground voltage at a third location proximate to the memory device 513. For example, the ADC 517 measures the third ground voltage near pins of the memory device 513. In some examples, if the ground return current is not predominantly perpendicular to the memory device 513, the ADC 517 can measure the third ground voltage at several test points proximate to the memory device 513.

The management computing module 515 is configured to calculate an additional voltage delta between the first ground voltage at the processing unit 510 and the third ground voltage at the memory device 513. The management computing module 515 adjusts, based on the additional voltage delta, the first voltage threshold associated with the processing unit 510. That is, the management computing module 515 adjusts the first voltage threshold associated with the processing unit 510 to compensate for voltage drops in the ground plane of the motherboard 508.

In some examples, the management computing module 515 adjusts the first voltage threshold associated with the processing unit 510 such that the third ground voltage associated with the memory device 513 is added to the first voltage threshold associated with the processing unit 510. Specifically, the management computing module 515 adjusts the first voltage threshold associated with the processing unit 510 such that a voltage difference between the first ground voltage associated with the processing unit 510 and the third ground voltage associated with the memory device 513 is negated, or compensated for. Thus, the ground offset and noise of the ground plane associated with the motherboard 508 is cancelled (or effectively cancelled).

For example, the first ground voltage associated with the processing unit 510 is 20 mV lower than the third ground voltage associated with the memory device 213. Thus, the first voltage threshold associated with the processing unit 210 needs to be raised by 20 mV for memory reads. The management computing module 515 adjusts the first voltage threshold associated with the processing unit 510 to add 20 mV to the first voltage threshold.

In some examples, the management computing module 515 adjusts a third voltage threshold associated with the memory device 513 such that the first ground voltage associated with the processing unit 510 is added to the third voltage threshold associated with the memory device 514. Specifically, the management computing module 515 adjusts the third voltage threshold associated with the memory device 512 such that a voltage difference between the first ground voltage associated with the processing unit 510 and the third ground voltage associated with the memory device 513 is negated, or compensated for. Thus, the ground offset and noise of the ground plane associated with the motherboard 508 is cancelled (or effectively cancelled).

For example, the third ground voltage associated with the memory device 513 is 20 mV higher than the first ground voltage associated with the processing unit 510. Thus, the third voltage threshold associated with the memory device 512 needs to be lowered by 20 mV for memory writes. The management computing module 515 adjusts the third voltage threshold associated with the memory device 512 to lower the second voltage threshold by 20 mV.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A system to minimize effects of ground plane noise, including:
 a processing unit including a first transmitter, a first receiver, and a first transistor, wherein the first transistor is coupled to the first receiver, the first transistor associated with a first ground voltage; and
 a memory device including a second transmitter, a second receiver, and a second transistor, wherein the second transistor is coupled to the second receiver, the second transistor associated with a second ground voltage;
 wherein the processing unit is coupled to the memory device,
 wherein the first transistor is coupled to the second transistor,
 wherein, when the processing unit is transmitting data to the memory device, the processing unit enables the first transistor and the memory device disables the second transistor such that a second threshold voltage associated with the second receiver is adjusted based on the first ground voltage.

2. The system of claim 1, wherein an output of the first transmitter and an input of the first receiver is coupled to an output of the second transmitter and an input of the second receiver.

3. The system of claim 1, wherein the first transistor is associated with the first ground voltage at a first location of a ground plane, and the second transistor is associated with the second ground voltage at the second location of the ground plane.

4. The system of claim 1, wherein the first transistor is coupled to the second transistor via a ground compensation trace.

5. The system of claim 4, wherein the ground compensation trace is an existing trace.

6. The system of claim 1, wherein the processing unit enables the first transistor and the memory device disables the second transistor such that the first ground voltage associated with the first receiver is added to the second threshold voltage associated with the second receiver.

7. The system of claim 6, wherein the processing unit enables the first transistor and the memory device disables the second transistor such that a voltage difference between the first ground voltage and the second ground voltage is negated.

8. The system of claim 1, wherein, when the memory device is transmitting data to the processing unit, the processing unit disables the first transistor and the memory device enables the second transistor such that a first threshold voltage associated with the first receiver is adjusted based on the second ground voltage.

9. A system to minimize effects of ground plane noise, including:
 a processing unit;
 a memory device;
 an analog to digital converter (ADC) configured to determine a first ground voltage at the processing unit and a second ground voltage at the memory device;
 a management computing module configured to:
  calculate a voltage delta between the first ground voltage and the second ground voltage; and
  adjust, based on the voltage delta, a first voltage threshold associated with the processing unit.

10. The system of claim 9, wherein the management computing module is further configured to adjust, based on the voltage data, a second voltage threshold associated with the memory device.

11. The system of claim 9, further including:
an additional memory device,
wherein the ADC is further configured to determine a third ground voltage at the additional memory device,
wherein the management computing module is further configured to:
calculate an additional voltage delta between the first ground voltage and the third ground voltage; and
adjust, based on the additional voltage delta, the first voltage threshold associated with the processing unit.

12. The system of claim 11, wherein the management computing module is further configured to adjust, based on the additional voltage data, a third voltage threshold associated with the additional memory device.

* * * * *